United States Patent [19]

Buonauro et al.

[11] 4,340,326
[45] Jul. 20, 1982

[54] BROKEN BIT DETECTOR

[75] Inventors: Andrew Buonauro, Mission Viejo; Richard Warner, Laguna Hills, both of Calif.

[73] Assignee: Cooper Industries, Inc., Houston, Tex.

[21] Appl. No.: 124,456

[22] Filed: Feb. 25, 1980

[51] Int. Cl.³ .......................... B23B 47/24; B23C 9/00
[52] U.S. Cl. .................................. 408/16; 51/165.72; 250/561; 408/6; 408/11; 408/67; 408/710; 409/128; 409/134; 409/137
[58] Field of Search .................. 408/710, 67, 16, 6, 408/11, 10, 9, 95, 8, 56, 58, 241 R; 15/316 R, 405; 29/DIG. 78; 409/133, 134, 128, 137; 51/165.72; 250/561, 575

[56] References Cited

U.S. PATENT DOCUMENTS

| | | | |
|---|---|---|---|
| 3,837,383 | 9/1974 | Ko | 408/67 |
| 3,954,342 | 5/1976 | Boeke | 250/575 |
| 3,973,858 | 8/1976 | Poisson et al. | 408/11 |
| 4,037,982 | 7/1977 | Clement | 408/67 |
| 4,051,880 | 10/1977 | Hestily | 408/67 |

Primary Examiner—William R. Briggs
Assistant Examiner—Jerry Kearns
Attorney, Agent, or Firm—Spensley, Horn, Jubas & Lubitz

[57] ABSTRACT

A broken bit detector for use in conjunction with printed circuit board drilling machines or the like. The detector includes a light emitter and a light sensor contained within a pressure foot. The light emitter projects a beam of light through a central opening in the pressure foot and toward the light detector. Normally, the beam will be broken by a drill bit which passes through the opening. If a bit is not present, the light beam will not be broken and will be detected by the photosensor. Pressurized air is forced outward from both the light emitter and light detector in order to prevent any chips created by the drilling operation from striking the emitter or detector. The use of the air creates a shield which results in an accurate detector having a long life.

9 Claims, 6 Drawing Figures

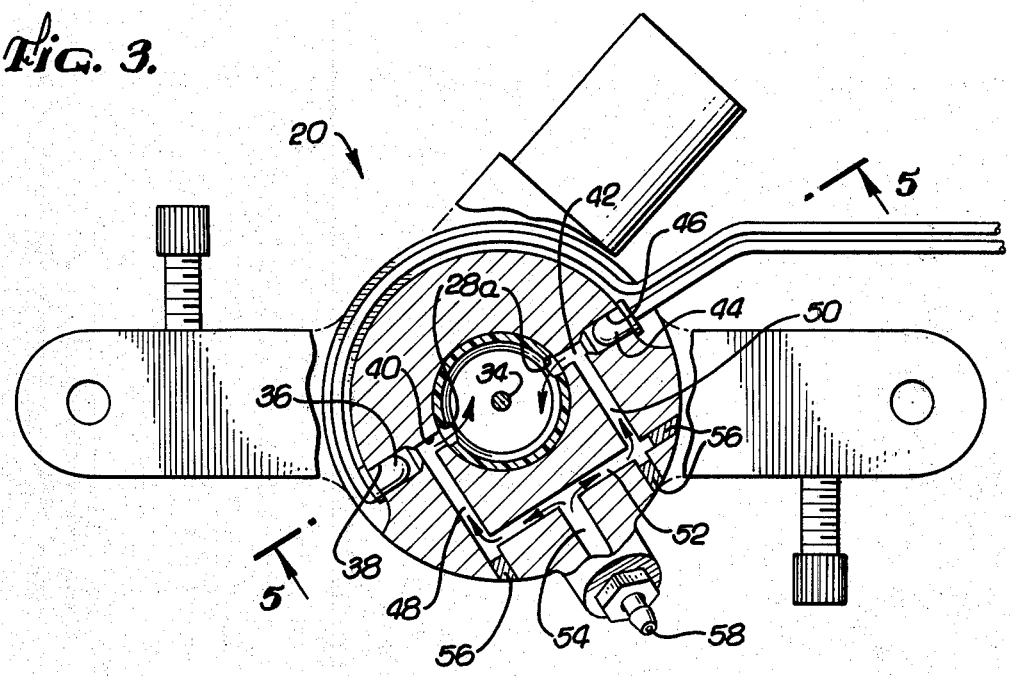
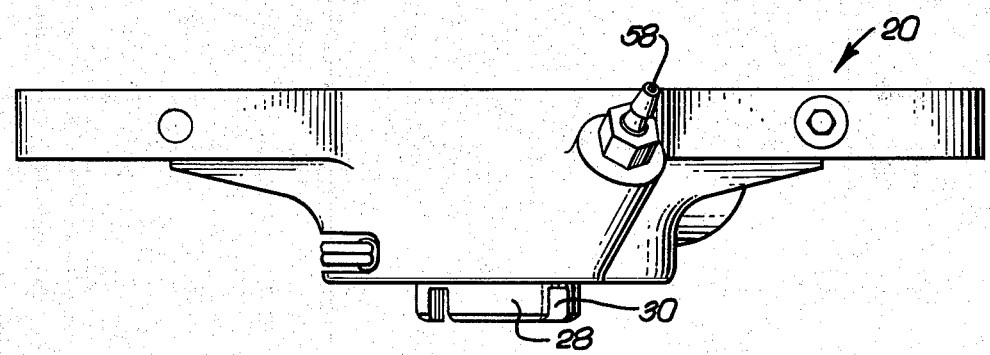
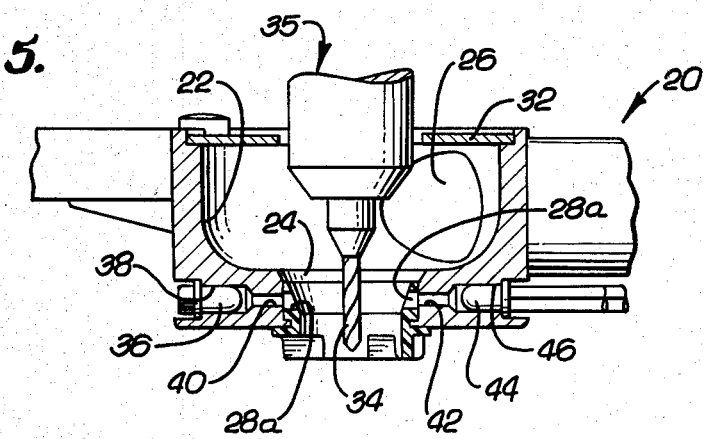

BROKEN BIT DETECTOR

BACKGROUND OF THE INVENTION

1. Field of the Invention

This invention relates to drilling machines and more particularly to machines utilized to drill printed circuit (PC) boards or the like. Specifically, this invention relates to the detection of broken bits in such drilling machines.

Printed circuit boards generally require holes to be drilled in them with high accuracy with regard to size and spacing. The drilling is usually done in a gang fashion on a machine having a plurality (typically three, four or eight) of individual drill spindles. The number of PC boards drilled at one time is equal to the number of spindles in the machine, i.e., only one hole at a time is drilled in an individual PC board. Since the machines operate at speeds of up to 400 cycles per minute, the drill or PC board must be repositioned extremely quickly between drilling cycles. The positioning of the drill spindles with respect to the PC boards is generally computer controlled.

Typical hole sizes which are drilled by the PC board drilling machines range from 0.008 inches to 0.25 inches. The combination of high drilling rate and small drill bit size occasionally results in a drill bit being broken. Because of the fact that several spindles are usually operating simultaneously and because of the high operating speeds employed, it is very difficult for an operator to observe when a drill bit is broken. Although breakage is relatively rare (on the order of one in every 20,000 holes which are drilled), it can be very costly because the entire PC board must be scrapped. This is especially so in the case of highly critical, extremely expensive PC boards such as are used in certain computers. Therefore, it is very desirable to have some method of accurately determining when a drill bit has been broken so that it can immediately be replaced.

2. Description of the Prior Art

Most drilling machines presently in use include a pressure foot which is movably connected to each drill spindle and presses down against the PC board to clamp the board in a fixed position for each drilling operation. The pressure foot includes a central opening through which the spindle chuck and drill bit extends. Although the pressure foot aids in obtaining accurate location of the holes, its presence makes it more difficult for the machine operator to observe the drill bits. In order to provide broken bit detection in spite of the masking presence of the pressure foot, attempts have been made to utilize light beam detection systems. In such systems, the drill bit lies in the path of the light beam which is directed towards a light sensor. Normally, a drill bit breaks the path of the beam and prevents the sensor from being activated. However, if the drill bit is broken, the beam will not be blocked and the sensor will be activated, thus indicating the absence of a complete bit. Such light beam systems have not been successful because they are quickly worn out by being hit by flying abrasive particles created during the drilling operation. The abrasiveness of these particles is such that the light emitter and sensor elements had to be replaced almost weekly.

In view of the foregoing, it is the primary object of the present invention to provide a broken bit detector for PC board drilling machines which is both accurate and rugged.

SUMMARY OF THE INVENTION

The present invention utilizes a light system which incorporates a shield to protect the system's elements. The system includes a light emitter which is positioned within the pressure foot so as to direct a light beam across the central opening of the foot along a path which coincides with the position of a drill bit. On the opposite side of the central opening is a photosensor which is located in the path of the beam. If a drill bit is in place and complete, the light beam will be blocked and the beam will not strike the photosensor. Both the light emitter and light sensor are recessed from the interior surface of the pressure foot which defines the central opening. Pressurized air is forced out of the recesses and into the central opening. The positive air pressure provides a shield which prevents any debris created during the drilling operation from entering the recesses and striking the detector elements. The use of the pressurized air as a shield does not interfere with the detector operation.

BRIEF DESCRIPTION OF THE DRAWINGS

In the drawings:

FIG. 3 is a top sectional view, partially cut away, taken along line 3—3 of FIG. 2;

FIG. 4 is a side plan view of the pressure foot;

FIG. 5 is a side view in section of a portion of the pressure foot taken along line 5—5 of FIG. 3.

DETAILED DESCRIPTION OF THE DRAWINGS

Figure 1:
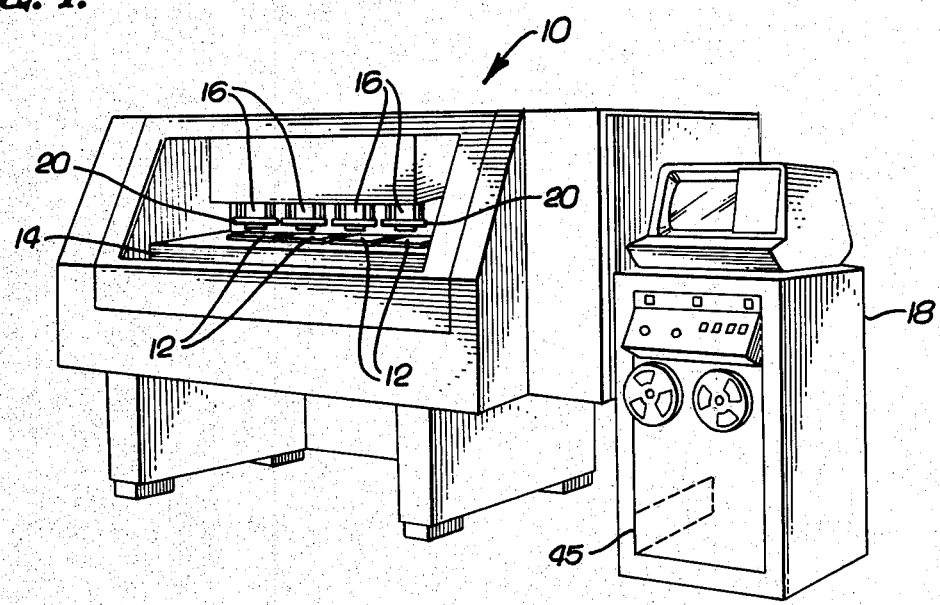
FIG. 1 is a perspective view of a typical PC board drilling machine with which the present invention is designed to be utilized.
Figure 2:
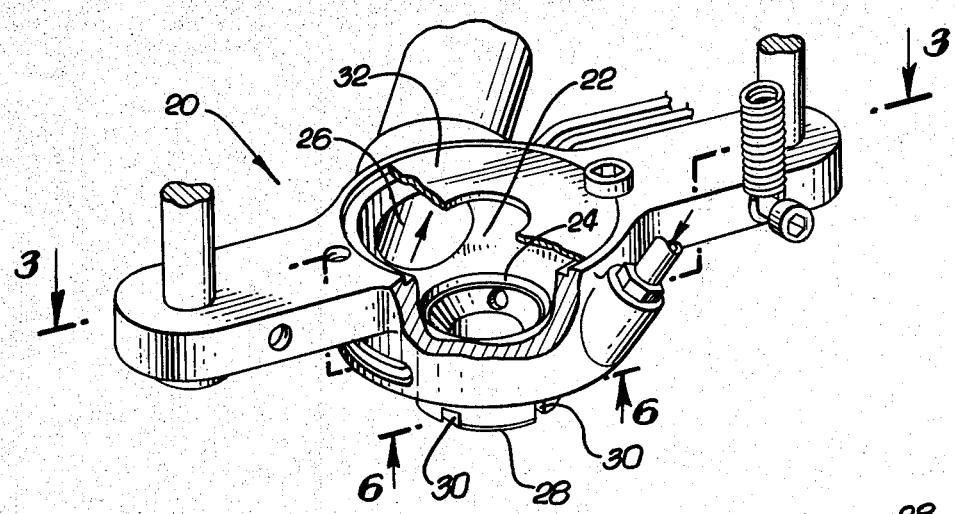
FIG. 2 is a perspective view of the pressure foot of the present invention.
Figure 6:
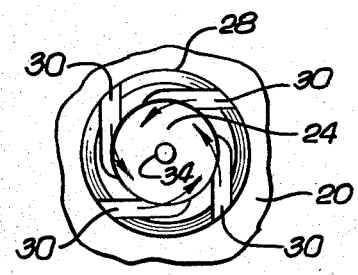
FIG. 6 is a plan view taken along line 6—6 of FIG. 2 showing air intake paths for the pressure foot.

Referring to FIG. 1, a PC board drilling machine 10 is shown with four PC boards (typically copper clad fiberglass) which rest upon a top table 14, which is made of cast iron in order to provide stability and damping. Carried above each of the PC boards 12 is a drill spindle 16. The portion of top table 14 upon which the PC boards 12 rest is movable with respect to the drill spindle 16 in order to facilitate the drilling of holes in different positions in the PC boards. Some types of drilling machines are designed so that the top table portion is movable along one axis and the drill spindles are movable along a second perpendicular axis, while in other designs the top table is movable along both axes. In both designs, the position of the drill spindles with respect to the PC boards, and therefore the hole configuration in an individual board, is controlled by means of a computer controller 18. It should be noted that the four-spindle machine described is illustrative only and that the present invention could be used with a drilling machine employing any number of spindles. Each spindle 16 includes a cast aluminum or other material pressure foot 20 extending from its lower end. As a spindle 16 is lowered into a drilling position, the bottom of the pressure foot 20 contacts the PC board 12 so as to clamp it into position for drilling. The spindle 16 is then moved downward and a drill bit extends through a central opening in the pressure foot 20.

Referring now to FIGS. 2-6, the pressure foot 20 of the present invention includes a bowl shaped section 22 having a circular opening 24 at its bottom. The bowl section 22 includes a vacuum outlet 26 which is adapted to be connected to a vacuum source for drawing drilling debris out of the bowl 22. The pressure foot 20 includes a donut shaped base plate section 28 which fits within the opening 24 and includes four conduits 30 (FIG. 6) which provide a path to the outside environment. When the pressure foot 20 is pressed downward against a PC board the section 28, which is made of delrin or similar non-abrasive material so as to prevent scraping of the PC board, will contact the board and fix its position. During drilling, a vacuum connected to the input 26 is activated, thus drawing air through the conduits 30 and creating a stream which draws drilling debris (chips, dust, etc.) into the bowl 22 and out through the vacuum line 26. The conduits 30 are substantially tangential to the central opening of the portion 28 and serve to create a vortex which causes the debris to move in a spiral fashion around the bowl 22 and into the vacuum line 26. During the vacuum operation, an upper plate 32 which is connected to the drill spindle, serves to seal the top of the bowl 22 so that the only air entries are through the conduits 30.

During a drilling cycle, a drill bit 34 held within a spindle chuck 35 (FIG. 5) passes through the center of the opening 24. As may be seen most clearly in FIGS. 3 and 5, a light emitter 36 is positioned within a recess 38 and directs a light beam through a conduit 40 and an opening 28a towards the center of the opening 24. During normal operation, the light beam will be intercepted by the drill bit 34 and therefore will not pass completely through the opening 24. If the bit has been broken, however, the beam will pass through the opening 24, through a second opening 28a, through a conduit 42 and strike a photodiode 44 which is located within a recess 46. Therefore, the receipt of light by the photodiode 44 signifies a broken or missing drill bit. The signal from the photodiode 44 can be used to halt the operation of the machine to enable replacement of the broken bit. Since the spindle chuck 35 or the top portion of even a broken bit will lie in the path of the light beam when the spindle is in a down position, the device is controlled by check for a broken bit only when the spindle is at the top of its stroke. The outputs of the light emitter 36 and photodiode 44 of each foot 20 are connected to a logic circuit 45 located in the controller 18. Many well known types of logic circuits can be provided. The logic control determines when a bit is broken and serves to halt the operation of the drilling machine upon such detection.

In order to protect the light emitter 36 and photodiode 44 from debris created by the drilling operation and swirled around by the vacuum force, pressurized air is forced through the conduits 40 and 42 and into the opening 24. This pressurized air prevents any chips or other debris from entering the conduits 40 and 42 and striking the light emitter 36 and photodiode 44. The pressurized air is supplied via a plurality of bores 48, 50, 52, and 54. The bores 48, 50 and 52 are plugged by means of three plugs 56, and an external source of pressurized air is connected to the bore 54 via an air input 58.

In summary, the present invention provides a light detector system to determine the presence of a broken bit and provides means for shielding the detector elements from chips and debris created during the drilling operation. The system operates in a simple fashion with the use of pressurized air, although many other fluids could be conveniently utilized. In addition, although the invention has been described in terms of a single embodiment, it should be recognized that it could be employed in many different types of drilling systems and is not limited to printed circuit board drilling machines. Furthermore, various modifications will occur to those skilled in the art (e.g., sensor elements, materials used, etc.) and the claims should therefore be interpreted to cover such modifications and equivalents.

We claim:

1. A broken bit detector for use in a drilling machine that includes a drill spindle which carries a drill bit, comprising:

a pressure foot adapted to be connected to the drill spindle, said pressure foot serving to clamp a workpiece into a fixed position with respect to the drill spindle and including a central opening through which a drill bit extends;

a light emitting element having a surface positioned on one side of said opening;

a light receiving element having a surface positioned on a side of said opening opposite from the light emitting element to receive a light beam therefrom, wherein a drill bit when in position lies in the path between the light emitting element and light receiving element and interception of the light beam indicates the presence of an unbroken drill bit; and means for directing a fluid across the surfaces of the light emitting and light receiving elements to thereby shield said elements from abrasive debris created by a drilling operation.

2. The detector of claim 1 wherein the pressure foot includes a pair of conduits opening into said central opening, the light emitting and receiving elements are recessed within said conduits and the fluid is directed so as to pass through the conduits away from the light emitting and receiving elements and into the central opening.

3. The detector of claim 1 wherein said fluid is pressurized air.

4. The detector of claim 3 wherein said central opening is substantially bowl shaped and includes an opening adapted for connection to a vacuum source to enable removal of debris from the opening.

5. The detector of claim 4 further including a base plate mounted to the bottom of the pressure foot and including an opening concentric with the central opening of the pressure foot, said base plate including at least one passageway providing an air path from the exterior of the base plate which is substantially tangential to the perimeter of the opening of the base plate, whereby a vortex is created when air is drawn through said passageway by vacuum action.

6. The detector of claim 1 wherein said pressure foot is made of cast aluminum.

7. The detector of claim 1 wherein said light receiving element is a photodiode.

8. The detector of claim 1 further including a logic circuit connected to the light emitting and light receiving elements, said logic circuit utilizing signals from the light receiving element to determine when a bit has been broken.

9. A drill system comprising:

a drill spindle carrying a drill bit;

a pressure foot movably secured to the drill spindle, said pressure foot for securing an article to be drilled in a fixed position, said pressure foot including:
a central opening through which the drill bit extends;
a light emitting element having a surface positioned on one side of said opening;
a light receiving element having a surface positioned on a side of said opening opposite from the light emitting element to receive a light beam therefrom, wherein a drill bit when in position lies in the path between the light emitting element and light receiving element and interception of the light beam indicates the presence of an unbroken drill bit; and
means for directing a fluid across the surfaces of the light emitting and light receiving elements to thereby shield said elements from abrasive debris created by a drilling operation.

* * * * *